United States Patent
Narushima et al.

(10) Patent No.: US 8,283,241 B2
(45) Date of Patent: Oct. 9, 2012

(54) DOPANT IMPLANTING METHOD AND DOPING APPARATUS

(75) Inventors: Yasuhito Narushima, Omura (JP); Shinichi Kawazoe, Omura (JP); Fukuo Ogawa, Omura (JP); Toshimichi Kubota, Omura (JP)

(73) Assignee: Sumco Techxiv Corporation, Omura-shi (JP)

( * ) Notice: Subject to any disclaimer, the term of this patent is extended or adjusted under 35 U.S.C. 154(b) by 359 days.

(21) Appl. No.: 12/600,885

(22) PCT Filed: May 23, 2008

(86) PCT No.: PCT/JP2008/059508
§ 371 (c)(1),
(2), (4) Date: Nov. 19, 2009

(87) PCT Pub. No.: WO2008/149686
PCT Pub. Date: Dec. 11, 2008

(65) Prior Publication Data
US 2010/0151667 A1    Jun. 17, 2010

(30) Foreign Application Priority Data

May 31, 2007 (JP) ................................. 2007-146080

(51) Int. Cl.
*H01L 21/04* (2006.01)
(52) U.S. Cl. ........ 438/510; 438/504; 438/513; 438/540; 438/565; 438/706; 257/E21.135
(58) Field of Classification Search .................. None
See application file for complete search history.

(56) References Cited

U.S. PATENT DOCUMENTS

| 5,553,566 A | 9/1996 | Chiou et al. |
| 5,744,396 A | 4/1998 | Chiou et al. |
| 2002/0092421 A1* | 7/2002 | Hayes et al. ................... 95/107 |
| 2004/0069214 A1* | 4/2004 | Choi et al. ................... 117/213 |

(Continued)

FOREIGN PATENT DOCUMENTS

JP    59-156993 A    9/1984
(Continued)

OTHER PUBLICATIONS

International Preliminary Report on Patentability and Written Opinion issued on Jan. 12, 2010 in a counterpart International Application No. PCT/JP2008/059508.

*Primary Examiner* — Kyoung Lee
(74) *Attorney, Agent, or Firm* — Holtz, Holtz, Goodman & Chick, PC

(57) ABSTRACT

A dopant device includes: a dopant holder that holds Ge which is solid at normal temperature and liquefies the Ge near a surface of the semiconductor melt, the dopant holder including a communicating hole for delivering the liquefied Ge downwardly; a cover portion for covering the Ge held by the dopant holder; and a vent provided on the cover portion for communicating with the outside. A dopant injecting method is carried out using such a dopant device, the dopant injecting method including: loading Ge dopant in a solid state into the doping device; liquefying the solid Ge dopant loaded into the doping device while holding the doping device at a predetermined height from a surface of a semiconductor melt; and doping the semiconductor melt with the liquefied Ge that is flowed from the communicating hole.

6 Claims, 13 Drawing Sheets

U.S. PATENT DOCUMENTS

2004/0089225 A1  5/2004  Ono et al.

FOREIGN PATENT DOCUMENTS

| JP | 05-085878 A | 4/1993 |
| JP | 06-001688 A | 1/1994 |
| JP | 08-295591 A | 11/1996 |
| JP | 9-007961 A | 1/1997 |
| JP | 2004-137140 A | 5/2004 |
| JP | 2004-175658 A | 6/2004 |
| JP | 2005-336020 A | 12/2005 |

* cited by examiner

DOPANT IMPLANTING METHOD AND DOPING APPARATUS

This application is a U.S. National Phase Application under 35 USC 371 of International Application PCT/JP2008/059508 filed May 23, 2008.

TECHNICAL FIELD

The present invention relates to a dopant injecting method and a doping device.

BACKGROUND ART

For growing a monocrystal by a CZ(Czochralski) method, there has been known a method for injecting germanium (Ge) as a secondary dopant in addition to a primary dopant such as red phosphorus (P) and arsenic (As).

Because Ge is solid at normal temperature, Ge is typically directly dropped into a semiconductor melt in a crucible.

However, when a solid material is directly dropped into a semiconductor melt, the semiconductor melt spatters due to the drop, and foulings on a chamber or a furnace are dropped off during pulling up a crystal, which hampers monocystallization. Further, when a solid material is dropped into the semiconductor melt, gas is introduced thereinto together with the drop of Ge and pinholes are generated, thereby lowering a yield rate of monocrystals.

Thus, Patent Document 1 has suggested that a low-melting-point dopant such as Ge is loaded into a low-melting-point-dopant injection tube which has a side wall and an upper portion hermetically sealed and has a grid-like net formed on a lower portion, and the low-melting-point-dopant injection tube is soaked in a semiconductor melt, so that the low-melting-point dopant is melted by heat of the semiconductor melt and mixed with the semiconductor melt (for example, see Patent Document 1).

Patent Document 1: JP-A-2004-137140

DISCLOSURE OF THE INVENTION

Problems to be Solved by the Invention

However, according to the technique disclosed in Patent Document 1, since the upper portion and the side wall of the dopant injection tube are hermetically sealed and therefore gas within the dopant injection tube cannot be escaped anywhere, the semiconductor melt in a crucible may be spilled when the dopant injection tube is soaked.

Similarly, since the upper portion and the side wall of the dopant injection tube are hermetically sealed, the semiconductor melt may be sucked into the dopant injection tube when the injection tube is pulled up. Consequently, the semiconductor melt may be solidified and the dopant injection tube may be cracked.

An object of the invention is to provide a dopant injecting method and a doping device capable of preventing scattering of a semiconductor melt and preventing contamination within a pulling-up device in injecting dopant for doping the semiconductor melt with Ge.

Means for Solving the Problems

According to an aspect of the invention, a dopant injecting method for doping a semiconductor melt with germanium (Ge) includes: loading the Ge in a solid state into a doping device including: a dopant holder that holds the Ge which is solid at normal temperature and liquefies the Ge near a surface of the semiconductor melt, the dopant holder including a communicating hole for delivering the liquefied Ge downwardly; a cover portion for covering the Ge held by the dopant holder; and a vent provided on the cover portion for communicating with an outside; liquefying the Ge in the solid state loaded into the doping device while holding the doping device at a predetermined height from the surface of the semiconductor melt; and doping the semiconductor melt with the liquefied Ge flowed from the communicating hole The predetermined height at which the Ge is held by the dopant holder is preferably decided such that the temperature of the Ge approximates to its melting point. For example, when a temperature of the semiconductor melt is 1412 degrees C., the height is preferably decided such that the Ge has a melting point of 958.8 degrees C.

According to the aspect of the invention, the Ge is loaded into the doping device and liquefied by heat of the semiconductor melt in the doping device. Then, the liquefied Ge is injected into the semiconductor melt through the communicating hole for doping. At this time, since the vent is provided on the cover portion of the doping device for communicating with the outside, pressure in an inner space surrounded by the cover portion and an outer space can be adjusted to prevent the liquefied Ge from being accumulated. Thus, the liquefied Ge can be quickly injected into the semiconductor melt for doping from the communicating hole. In addition, the inner space of the cover portion that covers the Ge of the dopant holder is not hermetically sealed because of the vent. Thus, the semiconductor melt is not sucked into the doping device after being dropped off or thus the doping device is not cracked.

In the above arrangement, the communicating hole is preferably soaked in the semiconductor melt in at least one of the liquefying of the Ge and the doping of the semiconductor melt with the liquefied Ge.

By soaking the communicating hole in the semiconductor melt in at least one of the liquefying of the Ge and the doping of the semiconductor melt with the liquefied Ge, the semiconductor melt is not scattered. Thus, a pulling-up device is not contaminated as in a case when the Ge in a solid state or the like is directly injected into the semiconductor melt.

In the arrangement according to the aspect of the invention, the conduit tube is preferably soaked in the semiconductor melt in at least one of the liquefying of the Ge and the doping of the semiconductor melt with the liquefied Ge By soaking the conduit tube at the time of liquefying the Ge, the silicon melt is not scattered when the Ge, which is liquefied while the communicating hole is soaked in the semiconductor melt, is dropped into the silicon melt. Thus, a furnace can be prevented from being contaminated.

According to another aspect of the invention, a dopant injecting method for doping a semiconductor melt with germanium (Ge) includes: loading the Ge in a solid state into a doping device including: a dopant holder that holds the Ge which is solid at normal temperature and liquefies the Ge near a surface of the semiconductor melt, the dopant holder including an elongated communicating hole for delivering the liquefied Ge downwardly; a cover portion for covering the Ge held by the dopant holder; and a conduit tube provided below the dopant holder to deliver the liquefied Ge flowed from the communicating hole to the surface of the semiconductor melt; liquefying the Ge in the solid state loaded into the doping device while holding the doping device at a predetermined height from the surface of the semiconductor melt; and doping the semiconductor melt with the liquefied Ge flowed through the conduit tube from the communicating hole.

Here, although it is not required that the conduit tube is soaked in the semiconductor melt in the liquefying of the Ge or in the doping of the semiconductor melt with the liquefied Ge, the conduit tube is preferably soaked in the semiconductor melt in at least one of the liquefying of the Ge and the doping of the semiconductor melt with the liquefied Ge. More preferably, the conduit tube is soaked in the semiconductor melt both in the liquefying of the Ge and in the doping of the semiconductor melt with the liquefied Ge. Incidentally, when the communicating hole is not soaked, the conduit tube is preferably provided to prevent the furnace from being contaminated by scattering of the liquefied Ge dropped into the semiconductor melt.

According to the another aspect of the invention, the Ge is loaded into the doping device and is liquefied by heat of the semiconductor melt in the doping device. Then, the liquefied Ge is delivered to the semiconductor melt through the conduit tube. Thus, the semiconductor melt is not scattered and a monocrystallization within the pulling-up device is not deteriorated unlike an arrangement for directly dropping the solid Ge into the semiconductor melt. Additionally, since only lower end of the doping device is soaked in the semiconductor melt, impurities do not get mixed in the semiconductor melt.

Further, since the communicating hole is shaped in an elongated hole, the liquefied Ge does not remain in the dopant holder due to surface tension or the like. Thus, the liquefied Ge can be quickly delivered to the semiconductor melt.

Furthermore, by soaking the conduit tube in the semiconductor melt in at least one of the liquefying of the Ge and the doping of the semiconductor melt with the liquefied Ge, liquefaction of the Ge can be accelerated. In addition, even when the liquefied Ge is dropped into the semiconductor melt through the conduit tube, contamination of the furnace because of scattering of the melt can be prevented, thereby simplifying dopant injecting procedures.

In the above arrangement, the doping device preferably includes a vent provided on the cover portion for communicating with the outside.

With this arrangement, since the inner space of the cover portion covering the Ge in the dopant holder is not hermetically sealed, the liquefied Ge can be prevented from being not easily dropped off due to depressurization in the inner space. In addition, the semiconductor melt is not sucked into the doping device after being dropped off or thus the doping device is not cracked.

According to still another aspect of the invention, a doping device for doping a semiconductor melt with germanium (Ge) includes: a dopant holder that holds the Ge which is solid at normal temperature and liquefies the Ge near a surface of the semiconductor melt, the dopant holder including a communicating hole for delivering the liquefied Ge downwardly; a cover portion for covering the Ge held by the dopant holder; and a conduit tube provided below the dopant holder to deliver the liquefied Ge flowed from the communicating hole to the surface of the semiconductor melt, in which the communicating hole is shaped in an elongated hole.

In the above arrangement, the cover portion is preferably provided with a vent for communicating with the outside.

The doping device having such an arrangement is favorably applicable to the dopant injecting method according to the aspect of the invention as described above.

BEST MODE FOR CARRYING OUT THE INVENTION

Exemplary embodiment(s) of the invention will be described below with reference to the attached drawings.

First Embodiment

1. Overall Arrangement

Figure 1:
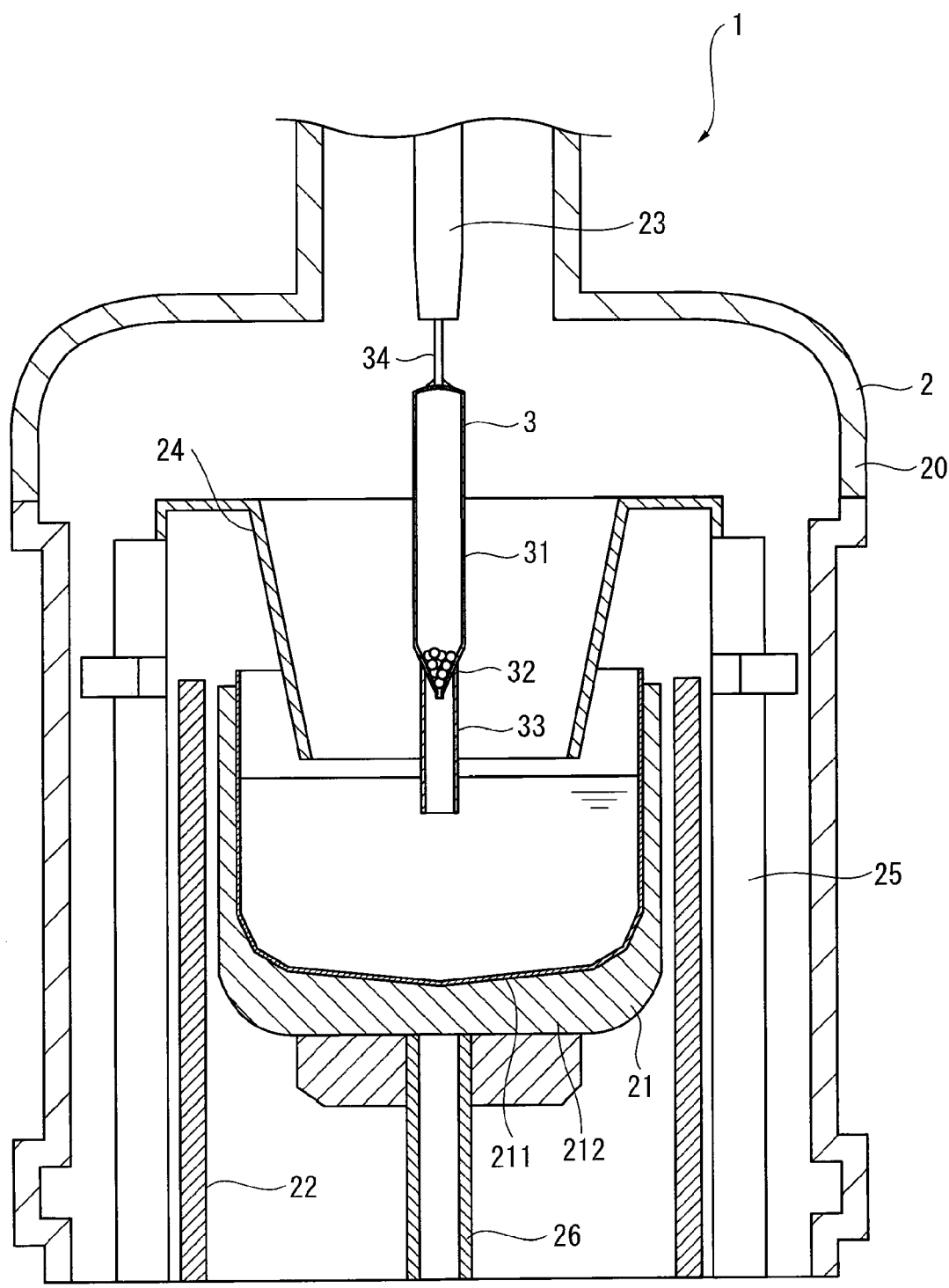
FIG. 1 is a cross-sectional view schematically showing an arrangement of a pulling-up device according to a first embodiment of the invention.

FIG. 1 shows an arrangement of a pulling-up device 1 according to a first embodiment of the invention.

The pulling-up device 1 includes a pulling-up device body 2 and a doping device 3.

The pulling-up device body 2 includes a chamber 20, a crucible 21 disposed inside the chamber 20, a heater 22 for heating the crucible 21 by heat radiation, a pulling-up portion 23, a shield 24 and a heat insulating cylinder 25.

Inert gas such as argon gas is introduced into the chamber 20 from above to below. Pressure in the chamber 20 is controllable.

When doping is performed, the pressure in the chamber 20 is 5332 Pa or more and 79980 Pa or less.

The crucible 21 is used to melt polycrystal silicon, from which a semiconductor wafer is made, to yield a silicon melt. The crucible 21 includes: a first crucible 211 made of quartz and shaped in a cylinder having a bottom; and a second crucible 212 made of graphite and disposed at an outside of the first crucible 211 to house the first crucible 211. The crucible 21 is supported by a support shaft 26 that rotates at a predetermined speed.

The heater 22 is disposed at the outside of the crucible 21 and heats the crucible 21 to melt the silicon in the crucible 21.

The pulling-up portion 23, which is disposed above the crucible 21, is mounted with a seed crystal or the doping device 3. The pulling-up portion 23 is rotatable.

The heat insulating cylinder 25 is disposed so as to surround the crucible 21 and the heater 22.

The shield 24 is a heat-blocking shield for shielding radiant heat radiated from the heater 22 toward the doping device 3. The shield 24 surrounds the doping device 3 and covers the surface of the melt. The shield 24 is shaped in a cone that has a lower opening smaller than an upper opening.

2. Arrangement of Doping Device 3

Figure 2:
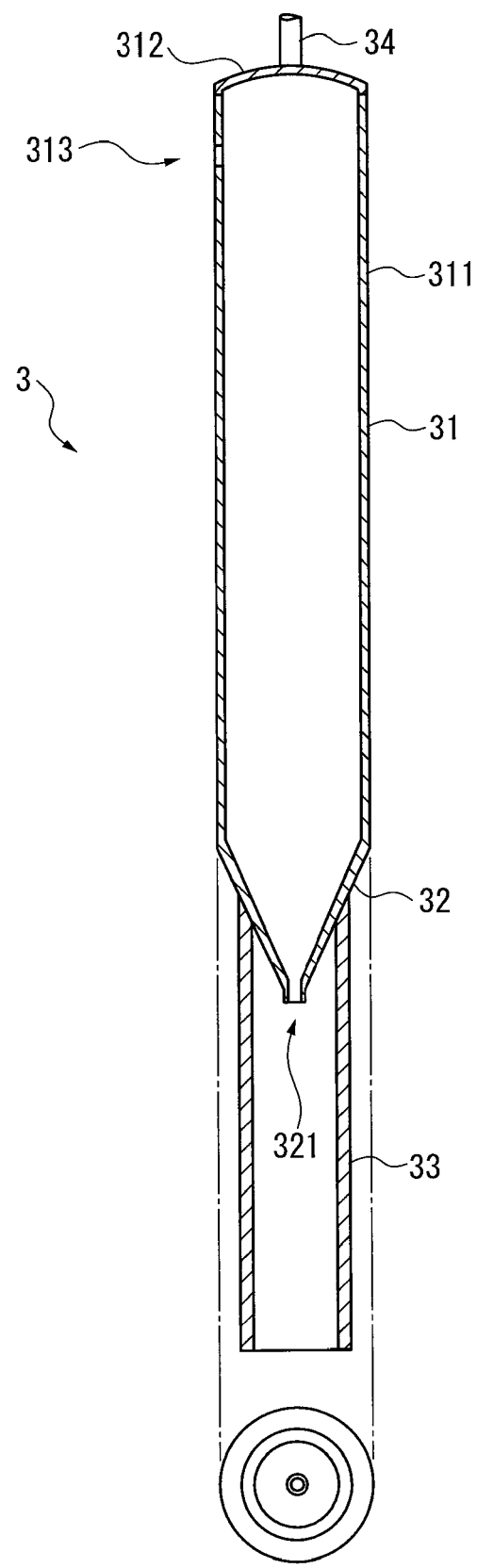
FIG. 2 shows an arrangement of a doping device according to the first embodiment.

The doping device 3 is for liquefying solid germanium (Ge) and injecting the liquefied germanium (Ge) into the silicon melt that is melted in the crucible 21. As shown in FIG. 2, the doping device 3 includes a cover portion 31, a dopant holder 32, a conduit tube 33 and a support 34. An upper end of the support 34 is attached to the pulling-up portion 23 of the device body 2 (see FIG. 1).

When a dopant is injected in the device body 2, the cover portion 31 protects the dopant housed inside. The cover portion 31 includes a trunk 311 shaped in a cylinder of which both ends are opened, and a lid 312 covering an upper end surface of the trunk 311.

The lid 312 is detachable from the trunk 311 to house a dopant inside. The support 34 is formed on an upper surface of the lid 312.

Also, a vent 313 is provided on a lateral side of the trunk 311 to communicate with the inside and outside the cover portion 31.

The dopant holder 32 holds the Ge dopant housed in the cover portion 31. The dopant holder 32 is an infundibulum shaped in a cone to cover a lower end surface of the trunk 311 of the cover portion 31. A circular communicating hole 321 is formed at a bottom center of this cone.

The communicating hole 321 has a smaller pore diameter than a grain diameter of the Ge dopant to prevent the Ge dopant in a solid state from being dropped off. However, when the pore diameter of the communicating hole 321 is too small, the liquefied Ge dopant may not be completely injected into the crucible 21 due to surface tension of the liquefied Ge dopant.

When the solid Ge dopant in the dopant holder 32 is liquefied, the conduit tube 33 delivers the liquefied Ge dopant into the silicon melt without spattering the liquefied Ge dopant. The conduit tube 33 is shaped in a cylinder having a smaller diameter than a diameter of the cover portion 31. An upper end of the conduit tube 33 is attached to an outer circumference of the cone of the dopant holder 32.

The cover portion 31, the dopant holder 32, and the conduit tube 33, which are included in the doping device 3, are all made of transparent quartz and united together by heat or the like.

3. Injecting Method of Ge Dopant Using Pulling-up Device 1

Next, a method for doping a silicon melt S with a Ge dopant D using the pulling-up device 1 will be described.

First of all, the lid 312 of the cover portion 31 is removed to load the Ge dopant D in a solid state inside. The Ge dopant D is stuck on and held by the dopant holder 32.

Next, the lid 312 is attached to the trunk 311, and the doping device 3 is attached to the pulling-up portion 23 of the device body 2.

Figure 3A:
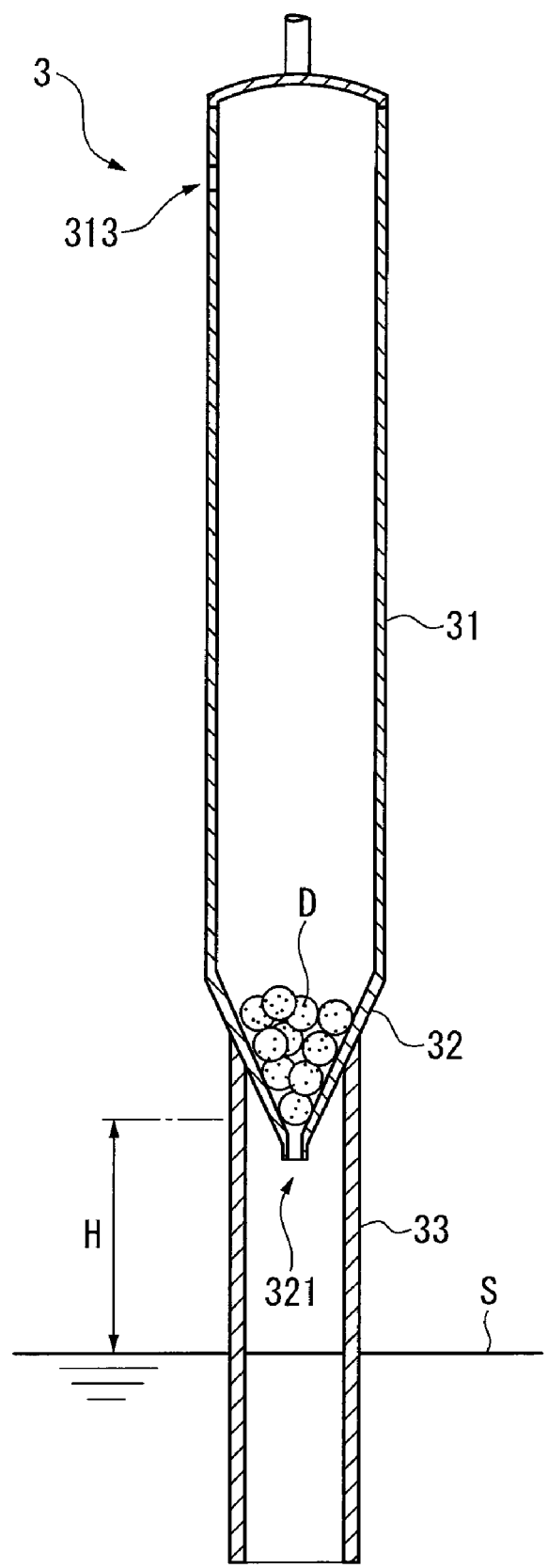
FIG. 3A is an illustration for explaining a doping method using the doping device according to the first embodiment.
Figure 3B:
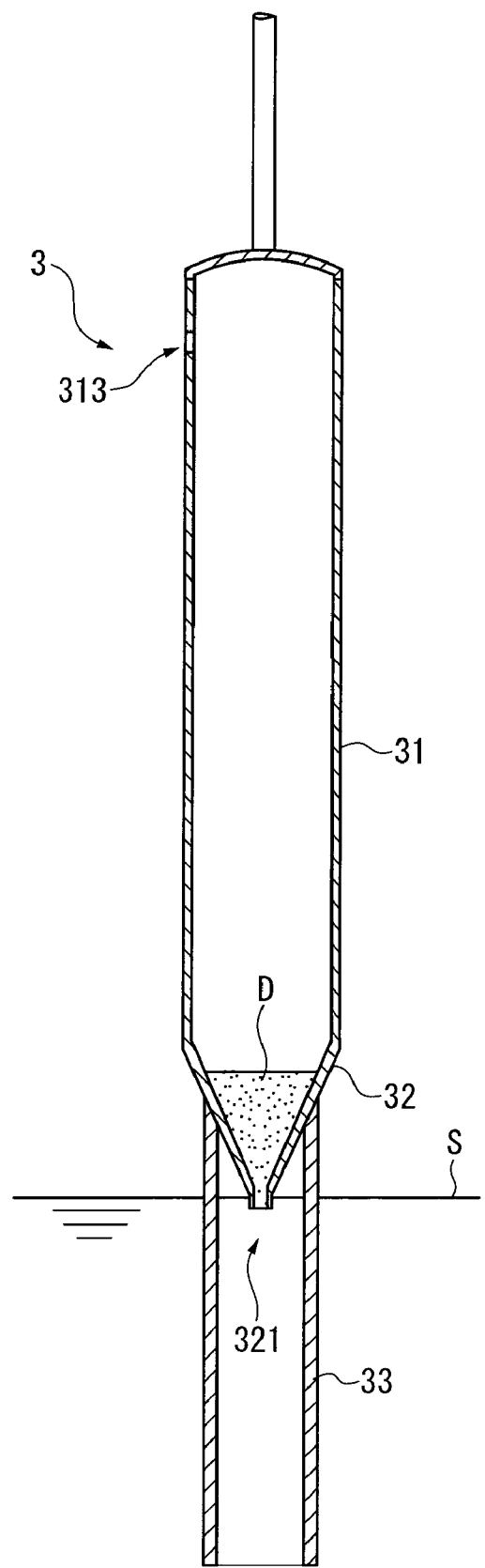
FIG. 3B is an illustration for explaining the doping method using the doping device according to the first embodiment.

Then, a position of the pulling-up portion 23 of the device body 2 is vertically adjusted to soak a lower end of the conduit tube 33 of the doping device 3 in the silicon melt S so that the Ge dopant D is spaced away by a predetermined height H from a surface of the silicon melt S as shown in FIG. 3A.

The height H is preferably decided such that the temperature of Ge approximates to its melting point to liquefy the Ge dopant by heat of the silicon melt S. Specifically, the Ge dopant in a solid state is preferably spaced away from the surface of the silicon melt S to have a melting point of approximately 958.8 degrees C.

When the Ge dopant D does not flow down through the conduit tube 33 due to surface tension although the Ge dopant is mostly liquefied, the doping device 3 is further lowered to soak the communicating hole 321 of the dopant holder 32 in the silicon melt S and diffuse the liquefied Ge dopant D in the silicon melt S. Incidentally, when the liquefied Ge dopant D properly flows down through the conduit tube 33 from the communicating hole 321, the communicating hole 321 is not needed to be soaked in the silicon melt S.

After the Ge dopant D is injected, the silicon melt S is doped with a primary dopant such as red phosphorus or arsenic.

Second Embodiment

Now, the second embodiment of the invention will be described below. In the description below, the same reference numerals will be attached to the components which are the same as the first embodiment, and the detailed description thereof will be omitted.

In the first embodiment, after the Ge dopant is liquefied and injected into the silicon melt S using the doping device 3, the silicon melt S is doped with the primary dopant such as red phosphorus or arsenic.

Figure 4:
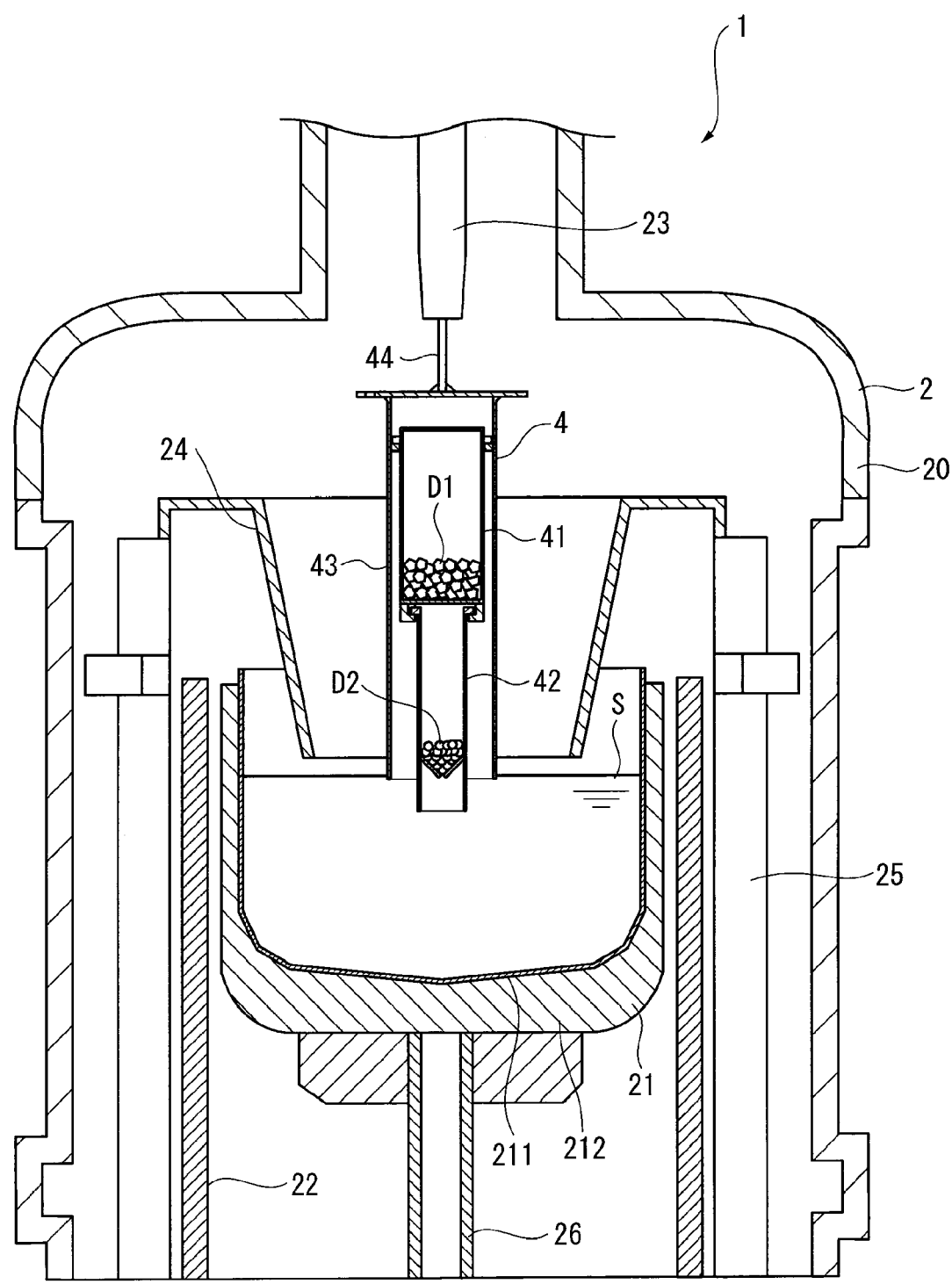
FIG. 4 is a cross-sectional view schematically showing an arrangement of a pulling-up device according to a second embodiment of the invention.

The second embodiment differs from the first embodiment in that, as shown in FIG. 4, a doping device 4 is used to inject into the silicon melt at the same time a primary dopant D1 such as red phosphorus or arsenic that is solid at normal temperature and is evaporated near a melting point of silicon and Ge dopant D2 (secondary dopant).

1. Arrangement of Doping Device 4

Figure 5:
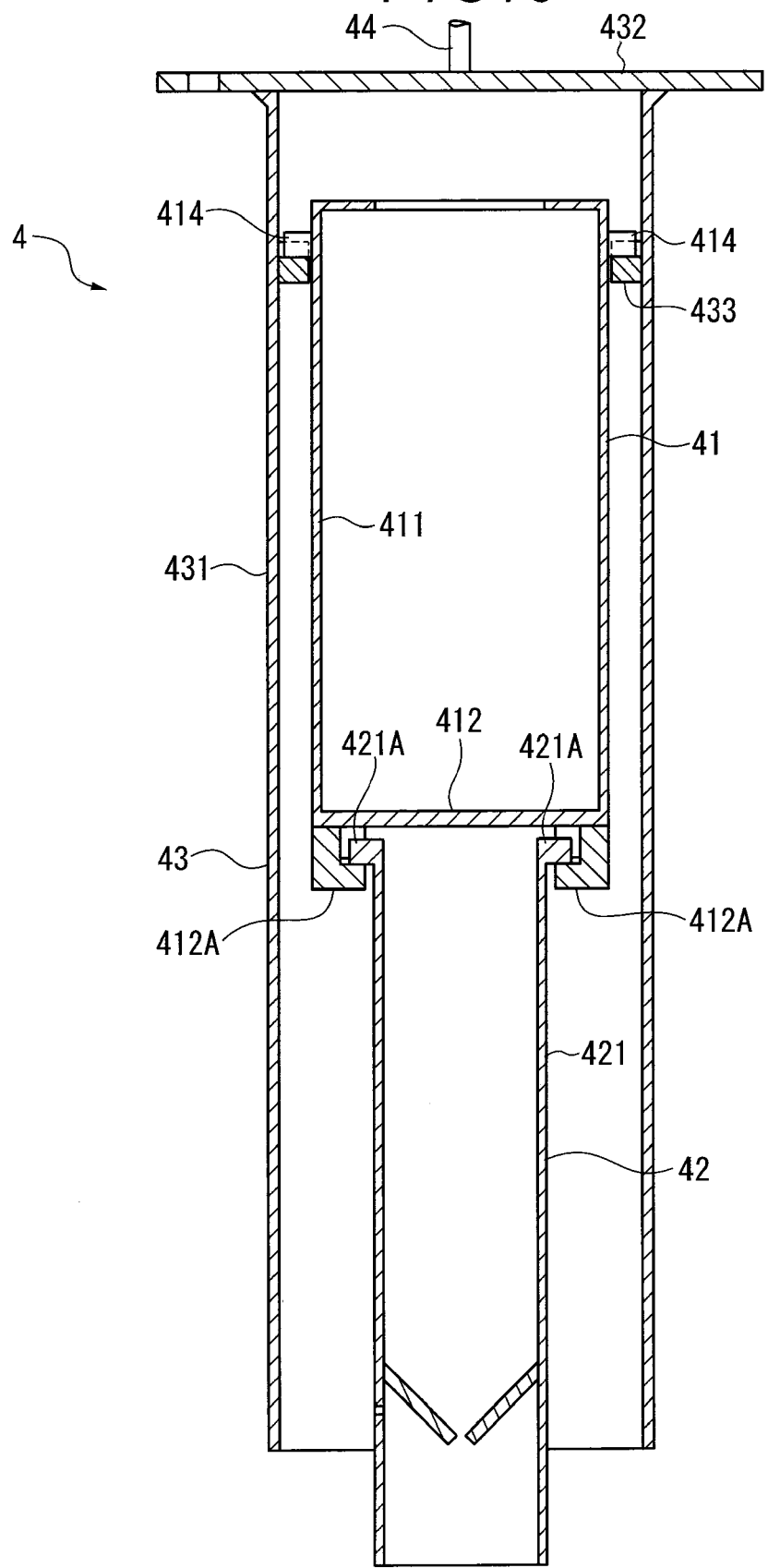
FIG. 5 shows an arrangement of a doping device according to the second embodiment.

As shown in FIG. 5, the doping device 4 includes a primary dopant accommodating portion 41, a secondary dopant accommodating portion 42, a guide 43, and a support 44. The secondary dopant accommodating portion 42 is provided below the primary dopant accommodating portion 41. The guide 43 covers an outer side of the primary dopant accommodating portion 41 and the secondary dopant accommodating portion 42. The support 44 is provided on an upper surface of the guide 43. An upper end of the support 44 is attached to the pulling-up portion 23 of the pulling-up device 1 (see FIG. 4).

The primary dopant accommodating portion 41, which accommodates the primary dopant D1, is shaped in a cylinder having a bottom.

Figure 6:
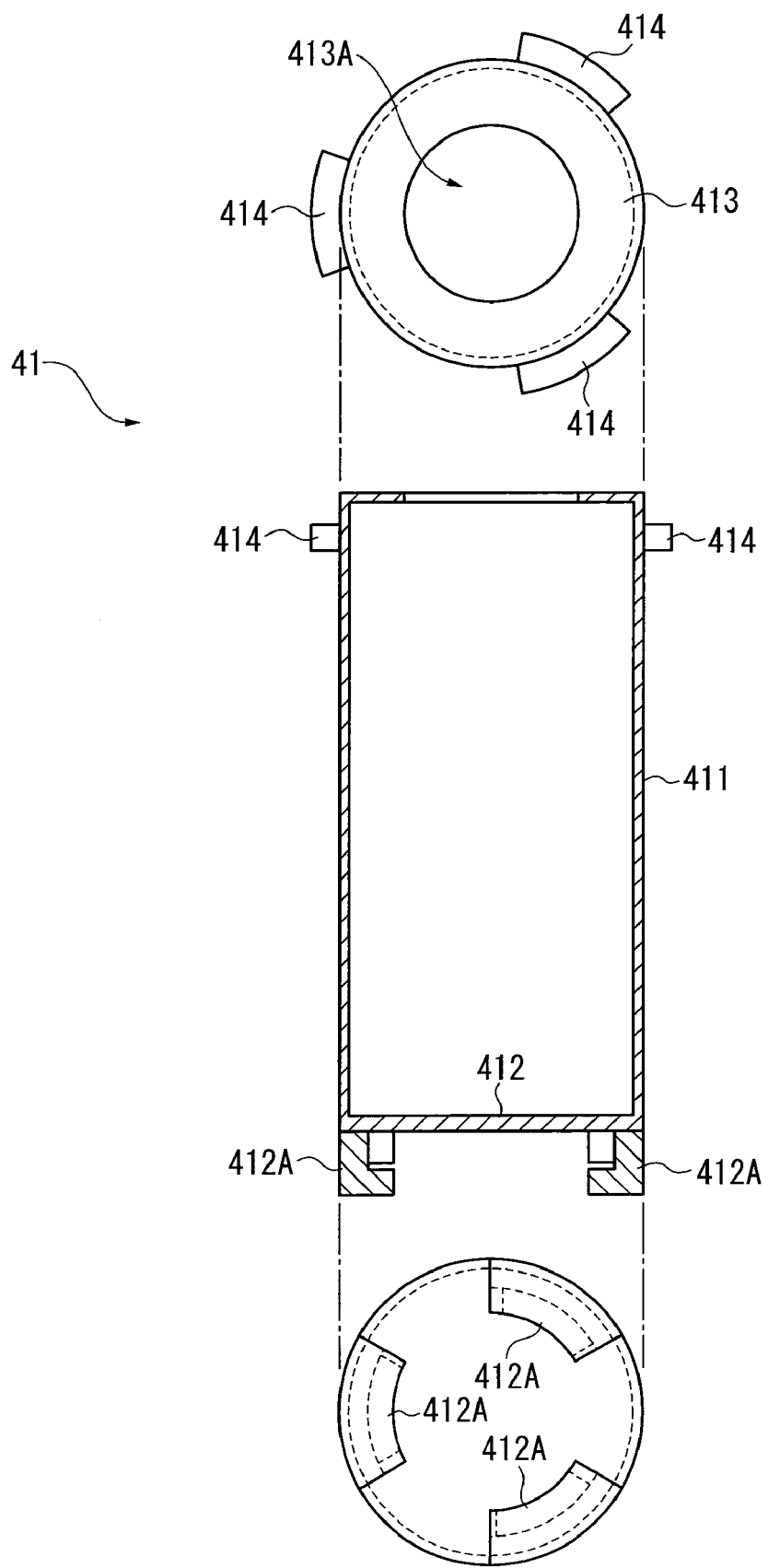
FIG. 6 shows an arrangement of a primary dopant accommodating portion in the doping device according to the second embodiment.

More specifically, as shown in FIG. 6, the primary dopant accommodating portion 41 includes a trunk 411 shaped in a cylinder, a bottom 412 covering a lower end surface of the trunk 411, and a lid 413 provided on an upper end surface of the trunk 411.

A plurality of projections 414 are provided to project from an upper outer circumference of the trunk 411.

The bottom 412 covers the lower end surface of the trunk 411 and supports the primary dopant D1 accommodated therein. A plurality of hook-shaped claws 412A are provided to project downward from an lower circumference of the bottom 412.

While the lid 413 covers the upper end surface of the trunk 411, an opening 413A is formed substantially at the center of the lid 413 to deliver dopant gas downwardly when the primary dopant D1 is evaporated.

Figure 7:
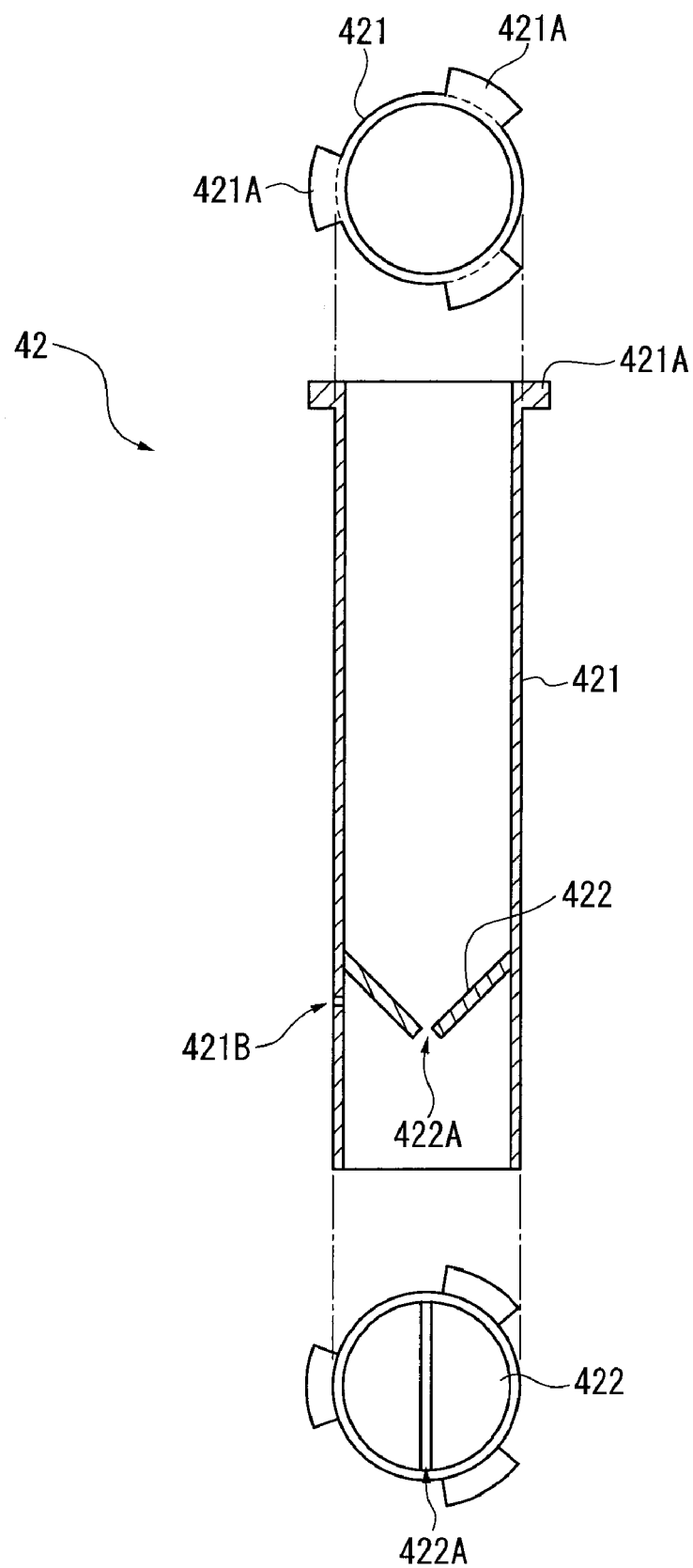
FIG. 7 shows an arrangement of a secondary dopant accommodating portion in the doping device according to the second embodiment.

As shown in FIG. 7, the secondary dopant accommodating portion 42 includes: a cylinder body 421 that has a smaller diameter than a diameter of the trunk 411 of the primary dopant accommodating portion 41; and a dopant holder 422 provided at an intermediate portion inside the cylinder body 421. A lower portion of the cylinder body 421, which is below the dopant holder 422, defines a conduit tube, and an upper portion of the cylinder body 421 defines a cover portion for accommodating the Ge dopant D2.

The cylinder body 421 is shaped in a cylinder of which both upper and lower ends are opened. A plurality of projections 421A are provided on an upper end of an outer circumference of the cylinder body 421. Also, a vent 421B is provided on the lower portion of the cylinder body 421, which is partitioned by the dopant holder 422, to communicate with the inside and outside the cylinder body 421.

The dopant holder 422 is provided by two plates disposed to form a valley shape. An angle between these two plates is, for instance, approximately 90 degrees. A space is provided on a lower end of these plates of the dopant holder 422 to provide a communicating hole 422A.

The communicating hole 422A is an elongated hole extending in a diametrical direction of the cylinder body 421. Incidentally, a width of the communicating hole 422A is set to be smaller than a grain diameter of the Ge dopant D2. For example, the width of the communicating hole 422A is set to be approximately 3 mm. When the width of the communicating hole 422A is too small, Ge dopant may not be completely injected into the crucible 21 due to surface tension of the liquefied Ge dopant.

The guide 43 prevents inert gas flowing from above to below in the pulling-up device 1 from being directly squirted onto the primary dopant accommodating portion 41, and delivers dopant gas generated by evaporation of the primary dopant D1 into the silicon melt S. The guide 43 includes a trunk 431 and a lid 432.

The trunk 431 is shaped in a cylinder having a large diameter and surrounds the primary dopant accommodating portion 41 and the secondary dopant accommodating portion 42. A plurality of engaging projections 433 are provided on an upper inner surface of the trunk 431.

The lid 432 is shaped in a circular plate to cover an upper surface of the trunk 431. An outer circumference of the lid 432 has a larger diameter than that of an outer circumference of the trunk 431. The above-described support 44 is formed substantially at the center of an upper surface of the lid 432.

The primary dopant accommodating portion 41, the secondary dopant accommodating portion 42, and the guide 43, which are all included in the doping device 4, are basically made of quartz. The plurality of projections 414 of the primary dopant accommodating portion 41 and engaging projections 433 of the guide 43 may be made of quartz, but may also be made of carbon or the like because a surface where quartz components contact with each other may be cracked.

On the other hand, claws 412A of the primary dopant accommodating portion 41 and projections 421A of the secondary dopant accommodating portion 42 are disposed below an engaging portion of the projections 414 and the engaging projections 433, and are exposed to high temperature. Thus, the claws 412A and the projections 421A are preferably made of quartz.

2. Assembly Method of Doping Device 4

For assembling the doping device 4, as shown in FIG. 5, the engaging projections 433 of the guide 43 are initially engaged with the projections 414 of the primary dopant accommodating portion 41. Then, the claws 412A on the lower surface of the primary dopant accommodating portion 41 are engaged with the projections 421A of the secondary dopant accommodating portion 42. Accordingly, the secondary dopant accommodating portion 42 is suspended from the primary dopant accommodating portion 41.

At this time, the projections 421A of the secondary dopant accommodating portion 42 as shown in FIG. 7 are inserted into portions which are not provided with the claws 412A of the primary dopant accommodating portion 41 as shown in FIG. 6, so that the projections 421A can be engaged with the claws 412A by rotating the secondary dopant accommodating portion 42.

When the secondary dopant accommodating portion 42 is suspended from the primary dopant accommodating portion 41, a slight space is provided between a lower surface of the bottom 412 and an upper end surface of the cylinder body 421. Thus, airflow between the inside and outside a portion corresponding to a cover portion of the secondary dopant accommodating portion 42 can be ensured through this space.

3. Dopant Injecting Method Using Doping Device 4

Figure 8:
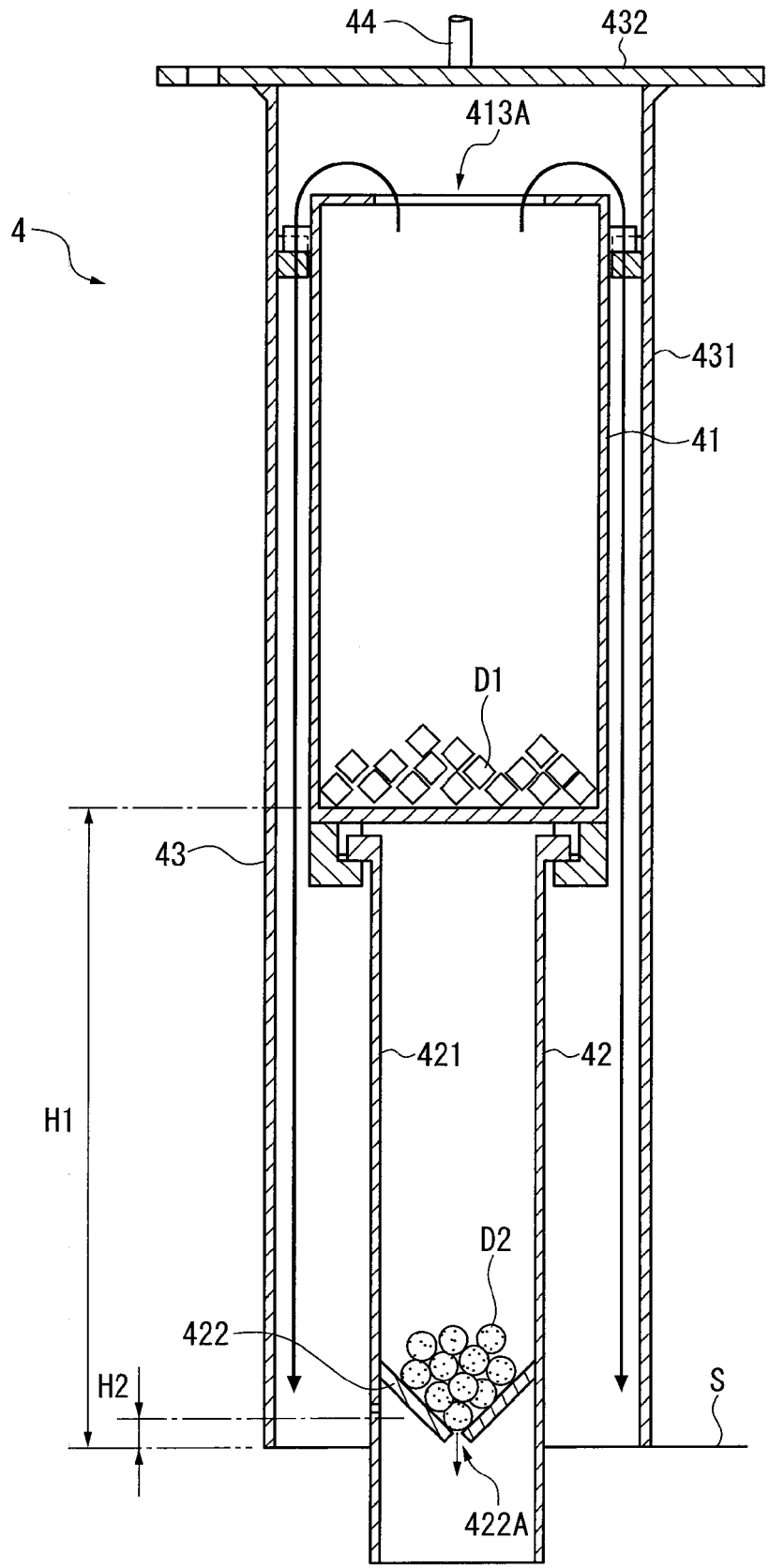
FIG. 8 is an illustration for explaining a doping method using the doping device according to the second embodiment.

A method for doping the silicon melt S with the primary dopant D1 and secondary dopant D2 using the above-described pulling-up device 1 will be described with reference to FIG. 8.

First of all, the guide 43 is attached to the pulling-up portion 23 of the pulling-up device 1. Subsequently, the primary dopant D1 is loaded into the primary dopant accommodating portion 41 and then the primary dopant accommodating portion 41 is mounted in the guide 43.

Next, the secondary dopant D2 is loaded into the secondary dopant accommodating portion 42, and the secondary dopant accommodating portion 42 is suspended from a lower portion of the primary dopant accommodating portion 41.

After the doping device 4 is assembled, the pulling-up portion 23 of the device body 2 is lowered to soak the lower end of the cylinder body 421 of the secondary dopant accommodating portion 42 in the silicon melt S. Incidentally, the lower end of the trunk 431 of the guide 43 may be soaked or not be soaked.

Here, a height H1 by which the primary dopant D1 is spaced away from a melt surface is preferably set to facilitate evaporation of the primary dopant D1. For example, when red phosphorus is used, the height H1 is preferably approximately 400 mm.

On the other hand, a height H2 by which the secondary dopant D2 is spaced away from the melt surface is preferably set to facilitate liquefaction of the secondary dopant D2. For example, the height H2 is preferably approximately 10 to 20 mm.

When the doping device 4 is held at the position as described above, the primary dopant D1 is evaporated by heat of the silicon melt S to generate dopant gas within the primary dopant accommodating portion 41. The dopant gas is discharged into the outside from the opening 413A of the lid 413. The discharged dopant gas is reflected by the lid 432 of the guide 43 and is delivered downwardly along the trunk 431 to be squirted onto the silicon melt S and be diffused in the silicon melt S.

On the other hand, the secondary dopant D2 is liquefied by heat of the silicon melt S and is delivered along an inner surface of the cylinder 421 from the communicating hole 422A of the dopant holder 422 to be diffused in the silicon melt S.

4. Advantages

The silicon melt S was doped with the primary dopant D1, which was red phosphorus, and the secondary dopant D2 at the same time in accordance with the procedures as described above. Then, the doped silicon melt S was pulled up to obtain ingot.

At this time, a doping amount of the red phosphorus was 150 g and a doping amount of Ge was 150 g while a charge amount of the silicon was 23 kg.

Figure 9:
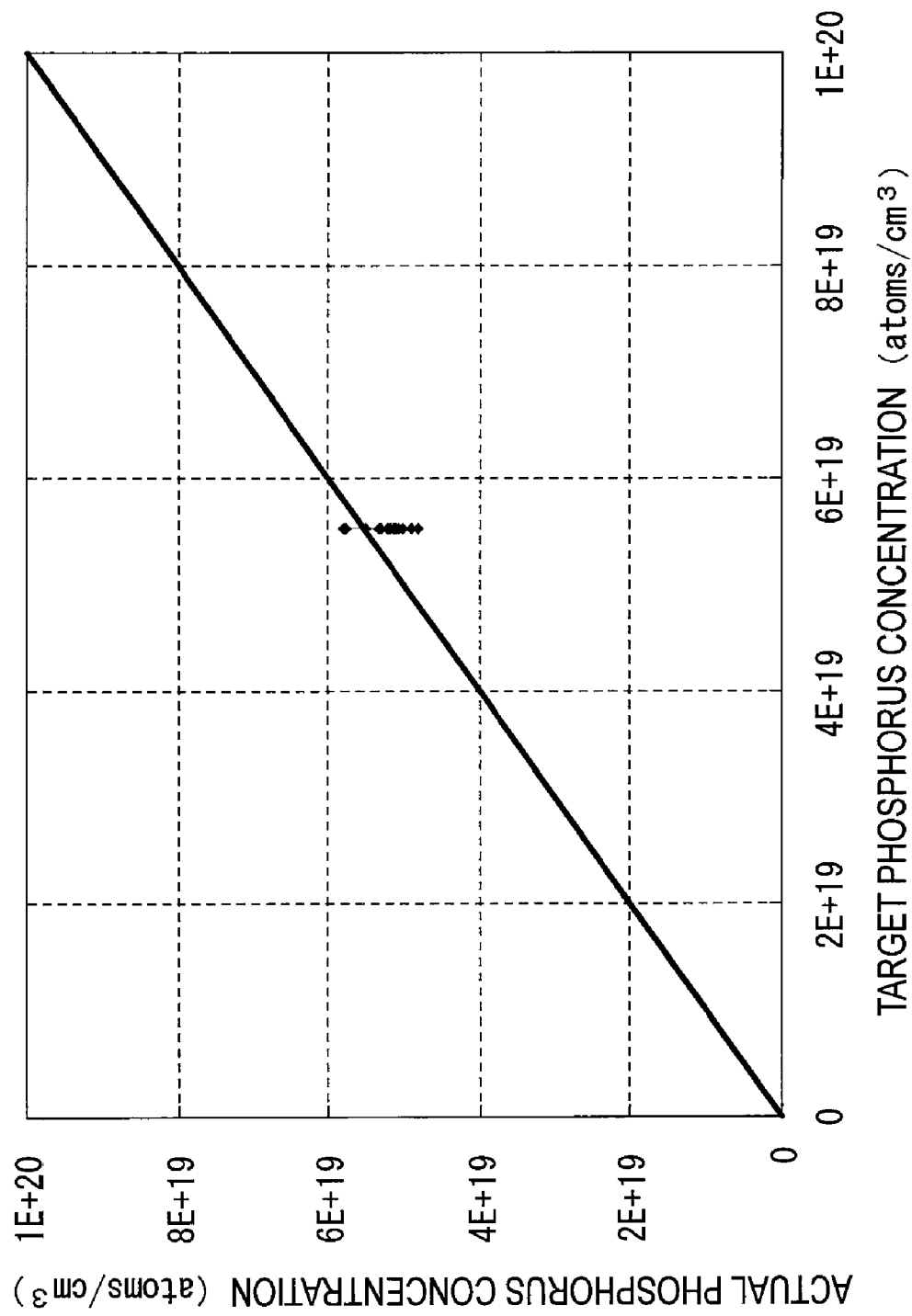
FIG. 9 is a graph for explaining advantages according to the embodiment.

Phosphorus concentration of a top portion of the pulled-up ingot relative to target concentration were checked and found distributed as shown in FIG. 9. Large variations relative to the target concentration were not observed.

Figure 10:
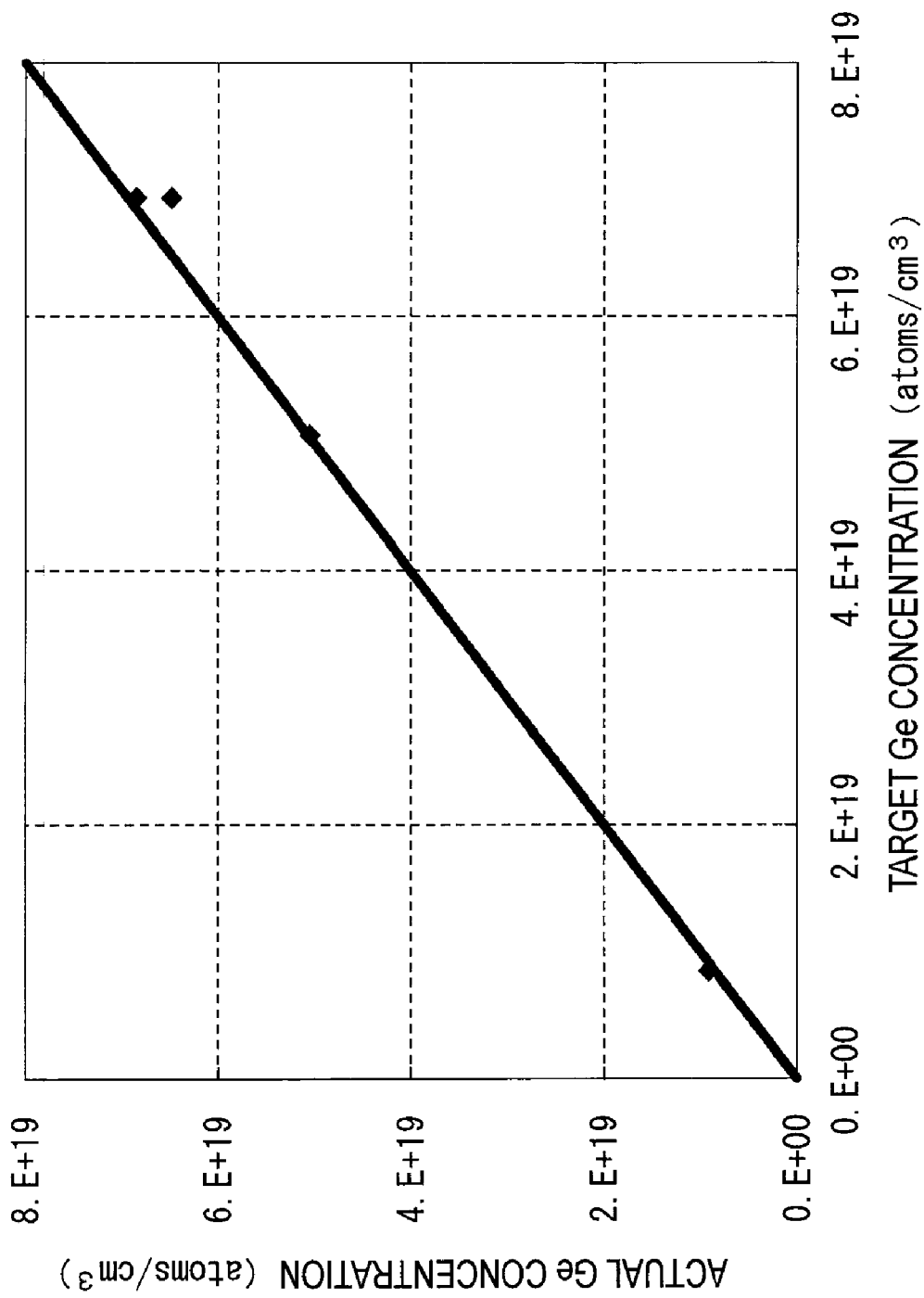
FIG. 10 is another graph for explaining advantages according to the embodiment.

On the other hand, Ge concentration of the top portion of the pulled-up ingot relative to target concentration were checked and distributed as shown in FIG. 10. Only a few variations relative to the target concentration were observed.

From these results, it has been found that red phosphorus and Ge can be simultaneously doped using the doping device 4 of the embodiments, and also found that the doping can be performed without large variations relative to target resistivity using the doping device 4 of the embodiment.

Modification of Embodiment(s)

The invention is not limited to the above-described embodiments but may include modifications as described below.

In the above-described embodiments, Ge is used as the secondary dopant for red phosphorus, arsenic or the like. However, when boron (B) is used as the primary dopant and Ge is used as the secondary dopant, the boron is injected into a crucible together with a silicon material to be dissolved and the Ge is subsequently injected as described above.

Although the secondary dopant accommodating portion 42 includes the dopant holder 422 having the communicating hole 422A shaped in an elongated hole in the doping device 4 for simultaneously injecting two types of dopants according to the second embodiment, the invention is not limited thereto.

Specifically, the secondary dopant accommodating portion 42 may be independently used for doping with Ge. At this time, an upper end surface of the secondary dopant accommodating portion 42 may be preferably closed with a lid or the like during doping.

Further, although the Ge dopant D is doped using the doping device 3 including the conduit tube 33 according to the first embodiment, the invention is not limited thereto.

Figure 11A:
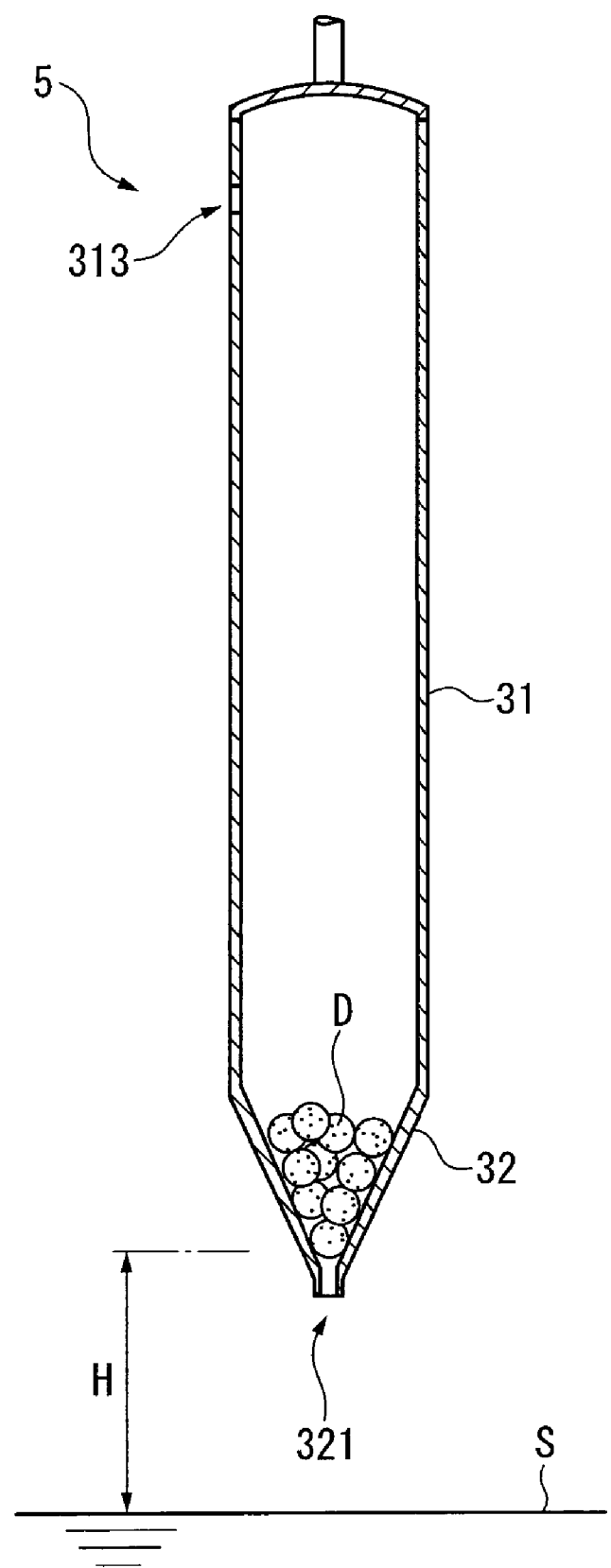
FIG. 11A is an illustration for explaining a doping method using a doping device according to a modification.
Figure 11B:
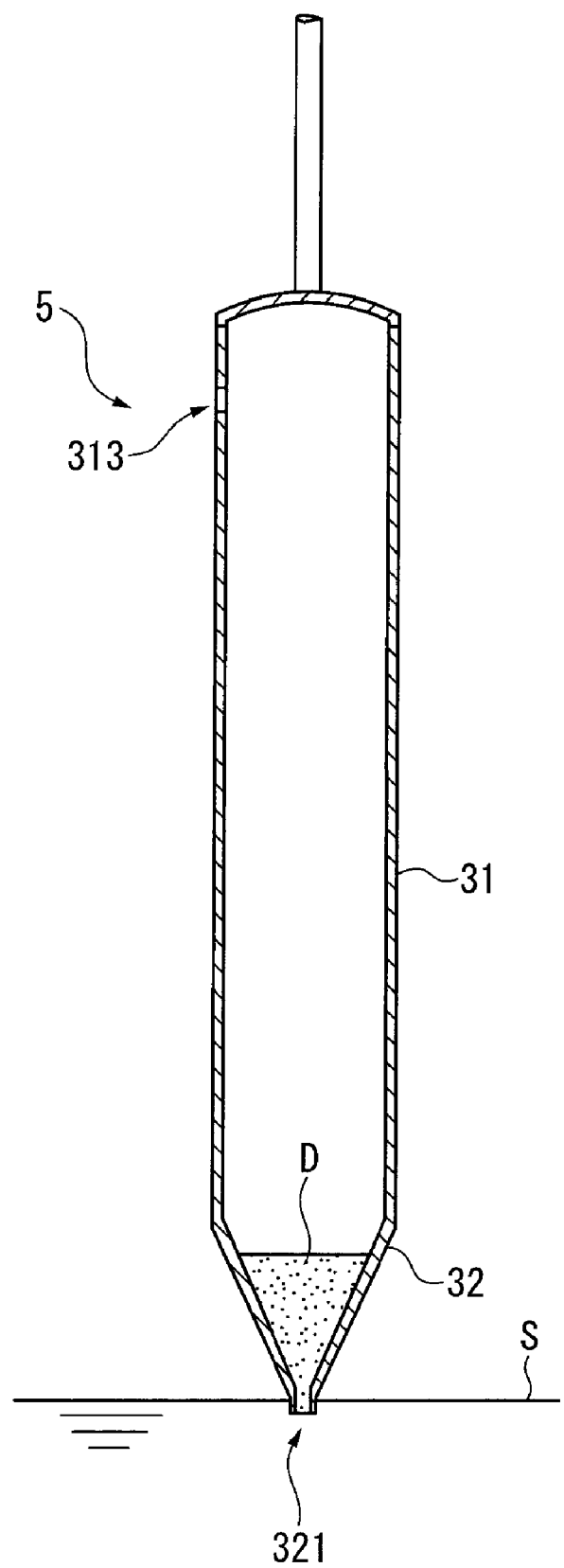
FIG. 11B is an illustration for explaining a doping method using a doping device according to a modification.

In other words, the Ge dopant D may be doped using a doping device 5 that does not include a conduit tube as shown in FIGS. 11A and 11B. At this time, similarly to the first embodiment, the doping device 5 is held for a predetermined time at a predetermined height H from a surface of the silicon melt S to liquefy the Ge dopant D as shown in FIG. 11A. After the Ge dopant D is mostly liquefied, the communicating hole 321 is soaked in the silicon melt S. Accordingly, the liquefied Ge dopant D is not dropped into the silicon melt S, so that a pulling-up device can be prevented from being contaminated inside by scattering of the liquid or the like.

In addition, specific structures, procedures and the like for carrying out the invention may be other structures and the like as long as an object of the invention can be achieved.

The invention claimed is:

1. A dopant injecting method for doping a semiconductor melt with germanium (Ge), the dopant injecting method comprising:
loading the Ge in a solid state into a doping device including: a dopant holder that holds the Ge which is solid at normal temperature and liquefies the Ge near a surface of the semiconductor melt, the dopant holder including a communicating hole for delivering the liquefied Ge downwardly; a cover portion for covering the Ge held by the dopant holder; a vent provided on the cover portion for communicating with an outside; and a conduit tube provided below the dopant holder for delivering the liquefied Ge flowed from the communicating hole into the surface of the semiconductor melt;
liquefying the Ge in the solid state loaded into the doping device while holding the doping device at a predetermined height from the surface of the semiconductor melt; and
doping the semiconductor melt with the liquefied Ge flowed from the communicating hole,
wherein the conduit tube is soaked in the semiconductor melt in at least one of the liquefying of the Ge and the doping of the semiconductor melt with the liquefied Ge.

2. The dopant injecting method according to claim 1, wherein the communicating hole is soaked in the semiconductor melt in at least one of the liquefying of the Ge and the doping of the semiconductor melt with the liquefied Ge.

3. A dopant injecting method for doping a semiconductor melt with germanium (Ge), the dopant injecting method comprising:
loading the Ge in a solid state into a doping device including: a dopant holder that holds the Ge which is solid at normal temperature and liquefies the Ge near a surface of the semiconductor melt, the dopant holder including an elongated communicating hole for delivering the liquefied Ge downwardly; a cover portion for covering the Ge held by the dopant holder; and a conduit tube provided below the dopant holder to deliver the liquefied Ge flowed from the communicating hole to the surface of the semiconductor melt;
liquefying the Ge in the solid state loaded into the doping device while holding the doping device at a predetermined height from the surface of the semiconductor melt; and
doping the semiconductor melt with the liquefied Ge flowed through the conduit tube from the communicating hole,
wherein the conduit tube is soaked in the semiconductor melt in at least one of the liquefying of the Ge and the doping of the semiconductor melt with the liquefied Ge.

4. The dopant injecting method according to claim 3, wherein the doping device includes a vent provided on the cover portion for communicating with an outside.

5. A doping device for doping a semiconductor melt with germanium (Ge), the doping device comprising:
a dopant holder that holds the Ge which is solid at normal temperature and liquefies the Ge near a surface of the semiconductor melt, the dopant holder including a communicating hole for delivering the liquefied Ge downwardly;
a cover portion for covering the Ge held by the dopant holder; and
a conduit tube provided below the dopant holder to deliver the liquefied Ge flowed from the communicating hole to the surface of the semiconductor melt,
wherein the communicating hole has an elongated shape.

6. The doping device according to claim 5, wherein the cover portion is provided with a vent for communicating with an outside.

* * * * *